United States Patent [19]

Imai

[11] Patent Number: 4,831,272

[45] Date of Patent: May 16, 1989

[54] APPARATUS FOR ALIGNING A RETICLE MARK AND SUBSTRATE MARK

[75] Inventor: Yuji Imai, Tokyo, Japan

[73] Assignee: Nikon Corporation, Tokyo, Japan

[21] Appl. No.: 167,725

[22] Filed: Mar. 14, 1988

[30] Foreign Application Priority Data

Mar. 19, 1987 [JP] Japan ............................ 62-65456

[51] Int. Cl.$^4$ ............................................. G01B 11/27
[52] U.S. Cl. .................................... 250/548; 356/400
[58] Field of Search ................... 250/548, 557, 561; 356/400, 401

[56] References Cited

U.S. PATENT DOCUMENTS

| | | | |
|---|---|---|---|
| 4,362,385 | 12/1982 | Lobach | 356/401 |
| 4,717,257 | 1/1988 | Kaneta et al. | 356/400 |
| 4,780,615 | 10/1988 | Suzuki | 250/548 |

Primary Examiner—Edward P. Westin
Attorney, Agent, or Firm—Shapiro and Shapiro

[57] ABSTRACT

An apparatus for projecting a pattern formed on a reticle onto a substrate through a projection optical system and detecting the positional relation between a first alignment mark of the reticle and a second alignment mark formed on the substrate includes a radiation source for applying radiation to the first alignment mark of the reticle, the radiation passed through the reticle being directed to the second alignment mark of the substrate by the projection optical system, photoelectric detectors for detecting the radiation reflected by the first alignment mark and the second alignment mark, the photoelectric detectors disposed at a position optically substantially conjugate with the entrance pupil of the projection optical system between the radiation source and the reticle, the photoelectric detectors disposed outside a predetermined area of the optic axis relative to the optic axis so that the radiation from the radiation source can pass through the predetermined area of the optic axis, and displacement apparatus responsive to the output of the photoelectric detectors to impart relative displacement between the reticle and the substrate.

4 Claims, 2 Drawing Sheets

APPARATUS FOR ALIGNING A RETICLE MARK AND SUBSTRATE MARK

BACKGROUND OF THE INVENTION

1. Field of the Invention

This invention relates to an alignment apparatus for an exposure apparatus used in the semiconductor manufacturing process.

2. Related Background Art

An alignment apparatus is known in which an alignment apparatus is known in which an alignment illuminating light from an alignment light source is directed onto a reticle having a first alignment mark through an optical system having a vibratory mirror and also onto a substrate to be projected having a second alignment mark through a projection lens and the reflected light from each mark produced by the alignment illuminating light is caused to branch off by the use of beam splitter disposed between the vibratory mirror and the reticle and a photoelectric converter for receiving the scattered light component of the reflected light is disposed at a position in the branching-off optical path which is conjugate with the conjugate position of the pupil of the projection lens.

In the prior art as described above, the alignment illuminating light and the alignment detection light are attenuated in the beam splitter portion by the beam splitter being inserted and further, the optical system of a light receiving system is added in the branching-off optical path of the beam splitter, and this has led to the problem that the entire alignment apparatus becomes complex.

SUMMARY OF THE INVENTION

It is the object of the present invention to provide an alignment apparatus in which a beam splitter is not used but at least one light receiving portion of a photoelectric converting unit is disposed in the optical system between an alignment light source and a reticle and at a marginal portion of the optic axis at a position substantially conjugate with the pupil of a projection lens.

In the present invention, the light receiving portion of the photoelectric converter is disposed at the marginal portion in the alignment light transmitting system and therefore, the illuminating light can be transmitted efficiently and reflected light for alignment (hereinafter referred to as the alignment detection light) can be received efficiently. Further, an optical system for receiving the alignment detection light becomes unnecessary and this leads to the simplified construction of the apparatus.

DESCRIPTION OF THE PREFERRED EMBODIMENTS

Figure 1:
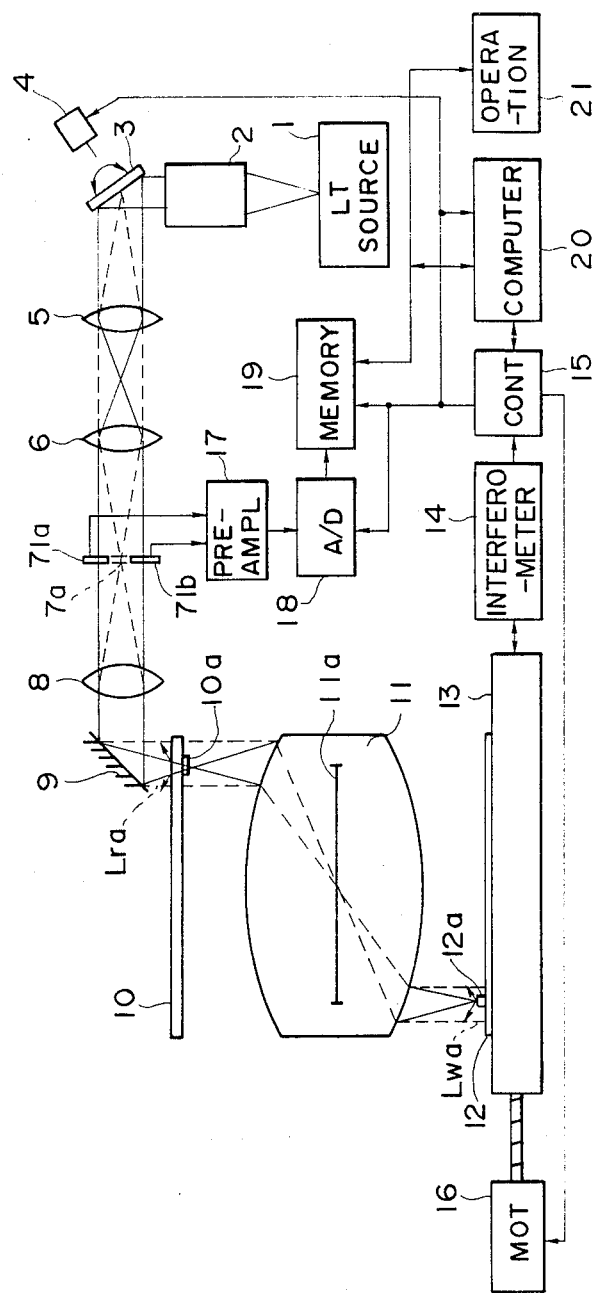
FIG. 1 shows the system construction of a embodiment of an apparatus according to the present invention.
Figure 2:
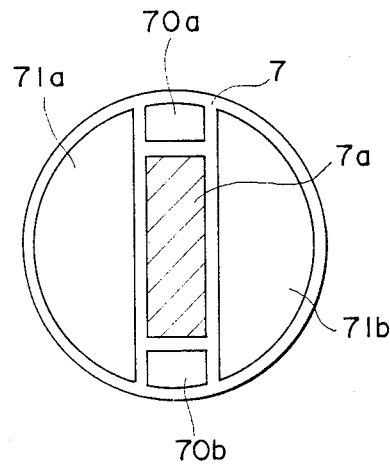
FIG. 2 shows an embodiment of a photoelectric converter.
Figure 3A:
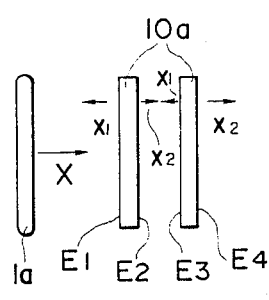
FIG. 3A shows the relation between a reticle alignment mark and an alignment illuminating light.
Figure 3B:
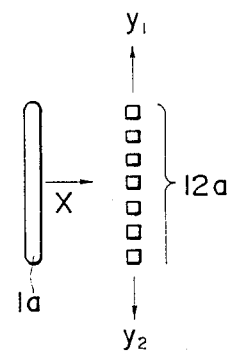
FIG. 3B shows the relation between a wafer alignment mark and the alignment illuminating light.

FIG. 1 shows the system construction of an embodiment of the present invention. An alignment illuminating light emitted from a light source 1 passes through a beam shaping optical system 2, is reflected by a vibratory mirror 3 whose center of vibration is the vicinity of the point of intersection between the optic axis and the reflecting surface of the vibratory mirror, and has its magnification changed by lenses 5 and 6, whereafter it passes through a window 7a provided in a photoelectric converter 7 (see FIG. 2), passes through an objective lens 8 and via a mirror 9, and is imaged on a reticle 10. A reticle alignment mark 10a is placed on the reticle 10 (see FIG. 3A). Accordingly, by the oscillation of the vibratory mirror 3, the alignment illuminating light 1a is scanned on the reticle alignment mark 10a in a direction x indicated in FIG. 3A, whereby scattered lights from the edges $E_1$, $E_2$, $E_3$ and $E_4$ of the mark 10a are obtained as a reticle alignment detection light $L_{ra}$ in the direction x and directions $x_1$ and $x_2$ opposite thereto. The alignment illuminating light passed through the reticle 10 passes through a projection lens 11 and is re-imaged on a wafer 12. A wafer alignment mark 12a is placed on the wafer 12 (see FIG. 3B). Accordingly, when by the oscillation of the vibratory mirror 3, the alignment illuminating light 1a is scanned on the wafer alignment mark 12a in a direction x indicated in FIG. 3B, the diffracted light from the diffraction pattern of the mark 12a is obtained as a wafer alignment detection light $L_{wa}$ in directions $y_1$ and $y_2$ orthogonal to the direction x. The reticle alignment detection light $L_{ra}$ and the wafer alignment detection light $L_{wa}$ enter the photoelectric converter 7. As indicated by broken lines in FIG. 1, the photoelectric converter 7 is conjugate with the position 11a of the entrance pupil of the projection lens 11 as seen from the reticle side, and is also conjugate with the vibratory mirror 3. This vibratory mirror may be replaced by a polygon mirror. The photoelectric converter 7 has the alignment illuminating passing window 7a at the center thereof as shown in the plan view of FIG. 2, and has a pair of photoelectric conversion elements 70a and 70b for receiving the reticle alignment detection light above and below the window 7a and a pair of photoelectric conversion elements 71a and 71b for receiving the wafer alignment detection light at the left and right of the window 7a. The photoelectric conversion elements 70a, 70b, 71a and 71b according to the embodiment of FIG. 2 are variable by the shapes of the alignment marks 10a and 12a and are merely an example. Alignment detection signals photoelectrically converted by the photoelectric conversion elements 70a, 70b, 71a and 71b are amplified in a preamplifier 17, whereafter the signals from the elements 70a and 70b corresponding to the reticle alignment mark are combined, and the signals from the elements 71a and 71b corresponding to the wafer alignment mark are combined, and the combined signals pass through an A/D converter 18 and are stored in a memory circuit 19. The A/D conversion and the storage into the memory are effected in synchronism with a vibratory mirror position signal pulse obtained from a rotary encoder for detecting the rotated position of the vibratory mirror 3 which is provided in a vibrator 4. That is, the position of the alignment illuminating light in the vibration amplitude corresponds to the rotated position of the vibratory mirror 3 and therefore, the alignment detection signals are stored in the memory circuit 19 in synchronism with a pulse generated by the rotary encoder of the vibrator 4 each time the alignment illuminating light travels a predetermined distance, and further, the coordinates of a wafer stage 13 when measurement of alignment is started by an interferometer system 14 for measuring the position of the wafer stage 13 are read by a stage controller and therefore, it becomes possible to know the relative relation between the scanning position of the alignment illuminating light and the position of the wafer stage.

Thus, if the relative positional relation between the reticle alignment signal and the wafer alignment signal is found by a computer 20 and a processor 21 exclusively for use for operation and thereafter the wafer stage 13 is moved by the amount of deviation from the alignment position by the use of the computer 20, the stage controller 15 and a motor 16, alignment of the reticle and the wafer can be accomplished.

In the present invention, there is no optical system for separating the light transmitting system and the light receiving system from each other and therefore the quantity of light is not attenuated and thus, a detection light of good S/N ratio is obtained. Further, if as in the embodiment, the positions of the vibratory mirror and the alignment illuminating light passing window in the photoelectric converter are in a conjugate relation, it will become possible to make the shape of the passing window small. As a result, it will become possible to make the light receiving surface of each photoelectric conversion element large, and this in turn will lead to the advantage that the detection rate and detection accuracy of the alignment detection light can be improved.

Also, in the present embodiment, design is made such that the illuminating light passed through the reticle is directed to the wafer, but the present invention also covers a case where design is made such that the illuminating light reflected by the reticle is directed to the wafer.

I claim:

1. An apparatus for projecting a pattern formed on a reticle onto a substrate through a projection optical system and detecting the positional relation between a first alignment mark of said reticle and a second alignment mark formed on said substrate, including:
    (a) applying means for applying radiation to said first alignment mark of said reticle, the radiation from said applying means passed through said reticle being directed to said second alignment mark of said substrate by said projection optical system;
    (b) photoelectric detector means for detecting the radiation reflected by said first alignment mark and said second alignment mark, said photoelectric detector means having a plurality of light receiving elements disposed at a position optically substantially conjugate with the entrance pupil of said projection optical system for said reticle side between said applying means and said reticle, said photoelectric detector means producing a detection signal conforming to the intensity of the radiation entering said plurality of light receiving elements, said plurality of light receiving elements being disposed outside a predetermined area through which the optic axis passes so that the radiation from said applying means can pass through said predetermined area; and
    (c) displacing means responsive to said detection signal to provide relative displacement between said reticle and said substrate.

2. An apparatus according to claim 1, wherein some of said plurality of light receiving elements are disposed so as to receive the scattered light of said radiation by one of said first and second alignment marks, and the remainder of said plurality of light receiving elements are disposed so as to receive the diffracted light of said radiation by the other of said first and second alignment marks.

3. An apparatus according to claim 2, wherein said applying means applies said radiation as a radiation beam extending in a predetermined direction to said reticle, said some of said plurality of light receiving elements are arranged in a direction substantially orthogonal to said predetermined direction so that said predetermined area intervenes therebetween, and said remainder of said plurality of light receiving elements are arranged in said predetermined direction so that said predetermined area intervenes therebetween.

4. An apparatus according to claim 2, wherein said applying means has means for making said radiation into a radiation beam extending in a predetermined direction, an optical member for vibrating said radiation beam in said predetermined direction in said reticle, and means for driving said optical member, said optical member being disposed at a position optically substantially conjugate with the position at which said plurality of light receiving elements are disposed.

* * * * *